United States Patent
Lee et al.

(10) Patent No.: US 9,768,395 B2
(45) Date of Patent: Sep. 19, 2017

(54) SOLAR CELL AND METHOD FOR MANUFACTURING THE SAME

(71) Applicant: Industrial Technology Research Institute, Hsinchu (TW)

(72) Inventors: Chia-Hua Lee, Taichung (TW); Hung-Ru Hsu, Changhua (TW); Yung-Tsung Liu, Taipei (TW); Shu-Nung Chang, Taichung (TW); Song-Yeu Tsai, Taipei (TW); Fu-Ming Lin, Zhudong Township (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/137,905

(22) Filed: Apr. 25, 2016

(65) Prior Publication Data
US 2016/0240797 A1     Aug. 18, 2016

Related U.S. Application Data

(62) Division of application No. 14/584,908, filed on Dec. 29, 2014, now Pat. No. 9,349,967.
(Continued)

(30) Foreign Application Priority Data

Dec. 12, 2014   (TW) .............................. 103143429 A

(51) Int. Cl.
*H01L 31/00* (2006.01)
*H01L 21/00* (2006.01)
(Continued)

(52) U.S. Cl.
CPC ...... *H01L 51/0077* (2013.01); *H01L 51/4226* (2013.01); *H01L 51/0008* (2013.01);
(Continued)

(58) Field of Classification Search
None
See application file for complete search history.

(56) References Cited

U.S. PATENT DOCUMENTS

| 6,023,073 A | 2/2000 | Strite |
| 7,671,272 B2 | 3/2010 | Sohn et al. |

(Continued)

FOREIGN PATENT DOCUMENTS

| CN | 101567404 A | 10/2009 |
| CN | 103474575 A | 12/2013 |

(Continued)

OTHER PUBLICATIONS

Burschka, Julian et al; Sequential deposition as a route to high-performance perovskite-sensitized solar cells; Nature, vol. 499, Jul. 18, 2013; pp. 316-320.
(Continued)

*Primary Examiner* — Eli Mekhlin
(74) *Attorney, Agent, or Firm* — Birch, Stewart, Kolasch & Birch, LLP

(57) ABSTRACT

Disclosed is a solar cell including a first electrode, a second electrode, and a first conversion layer disposed therebetween. The first electrode is closer to a light incident side than the second electrode. The first conversion layer is a composition-gradient perovskite. A part of the first conversion layer adjacent to the first electrode has an energy gap less than that of a part of the first conversion layer adjacent to the second electrode.

8 Claims, 10 Drawing Sheets

Related U.S. Application Data

(60) Provisional application No. 62/025,180, filed on Jul. 16, 2014.

(51) Int. Cl.
    *H01L 51/00*     (2006.01)
    *H01L 51/42*     (2006.01)

(52) U.S. Cl.
    CPC ........... *H01L 51/424* (2013.01); *Y02E 10/549* (2013.01); *Y02P 70/521* (2015.11)

(56) References Cited

U.S. PATENT DOCUMENTS

2012/0146007 A1   6/2012   Snaith
2013/0199603 A1   8/2013   Snaith et al.
2013/0319529 A1   12/2013   Tsuda et al.

FOREIGN PATENT DOCUMENTS

| | | |
|---|---|---|
| CN | 103700769 A | 4/2014 |
| JP | 2014049596 A | 3/2014 |
| TW | 201427062 A | 7/2014 |
| WO | WO 2008/098797 A2 | 8/2008 |
| WO | WO 2013/030553 A1 | 3/2013 |
| WO | WO 2013/171517 A1 | 11/2013 |
| WO | WO 2013/171518 A1 | 11/2013 |
| WO | WO 2014/045021 A1 | 3/2014 |

OTHER PUBLICATIONS

Chen, Qi et al, Planar Heterojunction Perovskite Solar Cells via Vapor-Assisted Solution Process; Journal of the American Chemical Society; Dec. 20, 2013; pp. 622-625.

Liu, Mingzhen et al; Efficient planar heterojunction perovskite solar cells by vapour deposition; Department of Physics, Oxford OX1 3PU, UK; Sep. 19, 2013, vol. 501, Nature, pp. 395-402.

Ball et al., Energy Environ. Sci., 2013, 6, pp. 1739-1743.

Hao et al., J. Am. Chem. Soc. 2014, 136, pp. 8094-8099.

TW Office Action dated Oct. 6, 2015. pp. 1-3.

SOLAR CELL AND METHOD FOR MANUFACTURING THE SAME

CROSS REFERENCE TO RELATED APPLICATIONS

This application is a Divisional of U.S. patent application Ser. No. 14/584,908 (now U.S. Pat. No. 9,349,967), filed on Dec. 29, 2014 and entitled "Solar cell and method for manufacturing the same", which is based on, and claims priority from, Taiwan Application Serial Number 103143429, filed on Dec. 12, 2014, and claims the benefit of U.S. Provisional Application No. 62/025,180, filed on Jul. 16, 2014, the disclosure of which is hereby incorporated by reference herein in its entirety.

TECHNICAL FIELD

The technical field relates to a perovskite conversion layer of a solar cell, and in particular it relates to a composition-gradient perovskite layer and method for manufacturing the same.

BACKGROUND

Organic metal perovskite materials are potential materials for solar cells due to their excellent physical properties. Organic lead halide perovskite has a higher efficiency over other perovskite materials. The major conventional method for forming a perovskite layer is coating. For example, two precursors of the perovskite are dissolved in an organic solvent (e.g. DMF), and then spin-coated on an electrode. Alternatively, lead halide ($PbX_2$) can be dissolved in an organic solvent and spin-coated to form a $PbX_2$ film on an electrode, and the $PbX_2$ film is then dipped in methylammonium iodide (MAI) to form a perovskite film of $Pb(CH_3NH_3)X_2I$. However, the solvent in the next coating step may dissolve the previously formed perovskite film formed previously. Even if the compositions in each of the coating processes are different, the solvent in different coating processes may dissolve the different compositions in previous coating processes. In short, the general coating processes cannot form a composition-gradient perovskite layer.

Accordingly, a novel method for manufacturing a composition-gradient perovskite layer is called-for.

SUMMARY

One embodiment of the disclosure provides a method of manufacturing a solar cell, comprising: providing m parts by mole of $M^1X^1_2$ by a first deposition source, providing 1−m parts by mole of $M^2X^2_2$ by a second deposition source, and providing an amount of $AX^1_tX^2_{(1-t)}$ by a third deposition source to deposit a first conversion layer on a first electrode, wherein the first conversion layer is a composition-gradient perovskite; and forming a second electrode on the first conversion layer, wherein a part of the first conversion layer adjacent to the first electrode has an energy gap lower than that of a part of the first conversion layer adjacent to the second electrode, wherein the first conversion layer has a composition of $M^1_mM^2_{(1-m)}AX^1_{(2m+t)}X^2_{(3-2m-t)}$, m is decreased with a longer deposition time, t is decreased with a longer deposition time, 1≥m≥0, and 1≥t≥0; wherein each of $M^1$ and $M^2$ is independently a divalent cation of Ge, Sn, or Pb, wherein A is a monovalent cation of methylammonium, ethylammonium, or formamidinium, wherein each of $X^1$ and $X^2$ is independently a monovalent anion of halogen, wherein $M^1$ has a lower atomic number than $M^2$, $X^1$ has a higher atomic number than $X^2$, or a combination thereof.

One embodiment of the disclosure provides a method of manufacturing a solar cell, comprising: providing m parts by mole of $M^1X^1_2$ by a first deposition source and providing 1−m parts by mole of $M^2X^2_2$ by a second deposition source to deposit a $M^1_mM^2_{(1-m)}X^1_{2m}X^2_{(2-2m)}$ layer on a first electrode; providing $AX^1$ or $AX^2$ by a third deposition source, such that $AX^1$ or $AX^2$ reacts with the $M^1_mM^2_{(1-m)}X^1_{2m}X^2_{(2-2m)}$ layer to form a first conversion layer on the first electrode, wherein the first conversion layer is a composition-gradient perovskite of $M^1_mM^2_{(1-m)}AX^1_{(2m+1)}X^2_{(2-2m)}$ or $M^1_mM^2_{(1-m)}AX^1_{(2m)}X^2_{(3-2m)}$; and forming a second electrode on the first conversion layer, wherein a part of the first conversion layer adjacent to the first electrode has an energy gap lower than that of a part of the first conversion layer adjacent to the second electrode, wherein m is decreased with a longer deposition time and 1≥m≥0; wherein each of $M^1$ and $M^2$ is independently a divalent cation of Ge, Sn, or Pb, wherein A is a monovalent cation of methylammonium, ethylammonium, or formamidinium, wherein each of $X^1$ and $X^2$ is independently a monovalent anion of halogen, wherein $M^1$ has a lower atomic number than $M^2$, $X^1$ has a higher atomic number than $X^2$, or a combination thereof.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
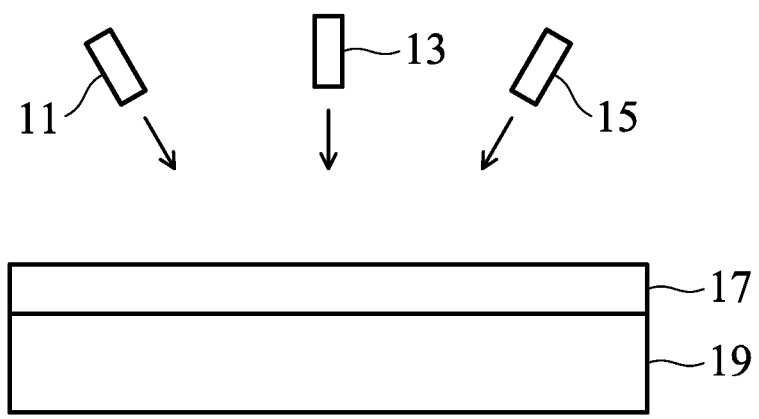
FIG. 1 shows the deposition of the conversion layer in one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

Figure 2A:
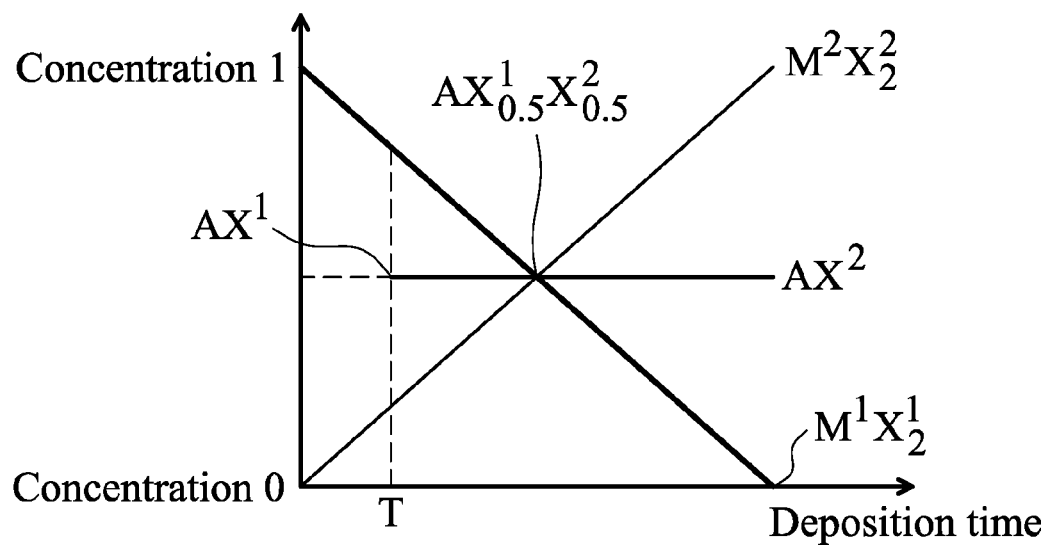
FIGS. 2A and 2B show lines of concentration versus deposition time of $M^1X^1_2$, $M^2X^2_2$, and $AX^1_tX^2_{(1-t)}$ in the deposition chamber of embodiments in the disclosure.
Figure 2B:
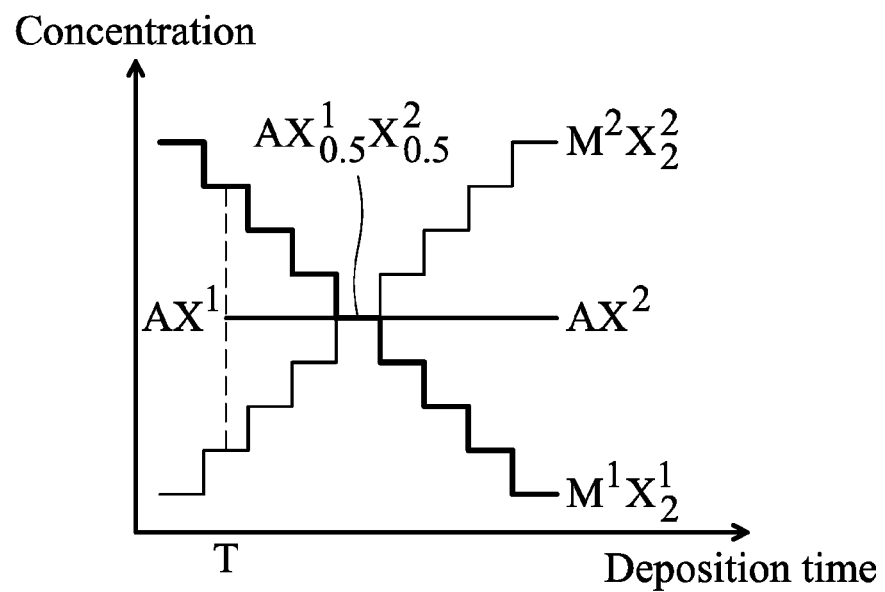

One embodiment of the disclosure provides a method for manufacturing a solar cell. As shown in FIG. 1, m parts by mole of $M^1X^1_2$ is provided by a deposition source 11, 1−m parts by mole of $M^2X^2{}_2$ is provided by a deposition source 13, and an amount of $AX^1{}_tX^2{}_{(1-t)}$ is provided by a deposition source 15, thereby depositing a conversion layer 17 on a first electrode 19, wherein the conversion layer is a composition-gradient perovskite. FIGS. 2A and 2B show concentrations of $M^1X^1{}_2$, $M^2X^2{}_2$, and $AX^1{}_tX^2{}_{(1-t)}$ at different deposition times in the deposition chamber of embodiments in the disclosure. Note that although only 1 part by mole of $M^1X^1{}_2$ reacts with $AX^1$ to form $M^1AX^1{}_3$ at start in FIGS. 2A and 2B, $M^1X^1{}_2$, $M^2X^2{}_2$, and $AX^1{}_tX^2{}_{(1-t)}$ may react to form $M^1{}_mM^2{}_{(1-m)}AX^1{}_{2m+t}X^2{}_{3-2m-t}$ at the start. In short, deposition can be started at time point T in FIGS. 2A and 2B rather than at time point 0. While the deposition time is increased, the m and t are decreased, $1 \geq m \geq 0$, and $1 \geq t \geq 0$. $M^1{}_mM^2{}_{(1-m)}AX^1{}_{2m+t}X^2{}_{3-2m-t}$ can be represented as $M^1{}_mM^2{}_{(1-m)}A[X^1{}_xX^2{}_{(1-x)}]_3$, wherein $x=(2m+t)/3$, and m and x are greater at a location that is closer to the electrode 19. Each of $M^1$ and $M^2$ is independently a divalent cation of Ge, Sn, or Pb. A is a monovalent cation of methylammonium, ethylammonium, or formamidinium. Each of $X^1$ and $X^2$ is independently a monovalent anion of halogen. $M^1$ has a lower atomic number than $M^2$, $X^1$ has a higher atomic number than $X^2$, or a combination thereof.

Figure 3:
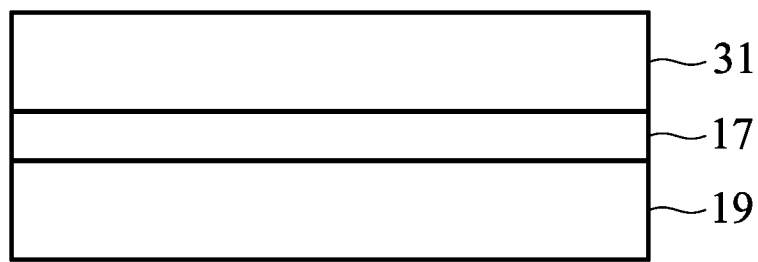
FIG. 3 shows a solar cell in one embodiment of the disclosure.

Subsequently, an electrode 31 can be formed on the conversion layer 17, as shown in FIG. 3. In one embodiment, the electrode 19 is an electrode of a light-incident side, and its composition should be transparent and electrically conductive such as fluorine doped tin oxide (FTO), indium tin oxide (ITO), zinc tin oxide (ZTO), or the like. The electrode 31 can be a general electrical conductor such as carbon material (e.g. active carbon or graphene) or metal (e.g. gold, silver, copper, aluminum, another electrically conductive metal, or an alloy thereof). In one embodiment, a metal oxide semiconductor material (e.g. titanium oxide, zinc oxide, nickel oxide, or tungsten oxide) can be disposed between the electrode 19 and the conversion layer 17 to serve as an electron transport layer. In another embodiment of the disclosure, a hole transport material such as Spiro-OMeTAD, P3HT, CuSCN, CuI, or PEDOT:PSS can be disposed between the electrode 31 and the conversion layer 17 to serve as a hole transport layer.

Figure 4A:
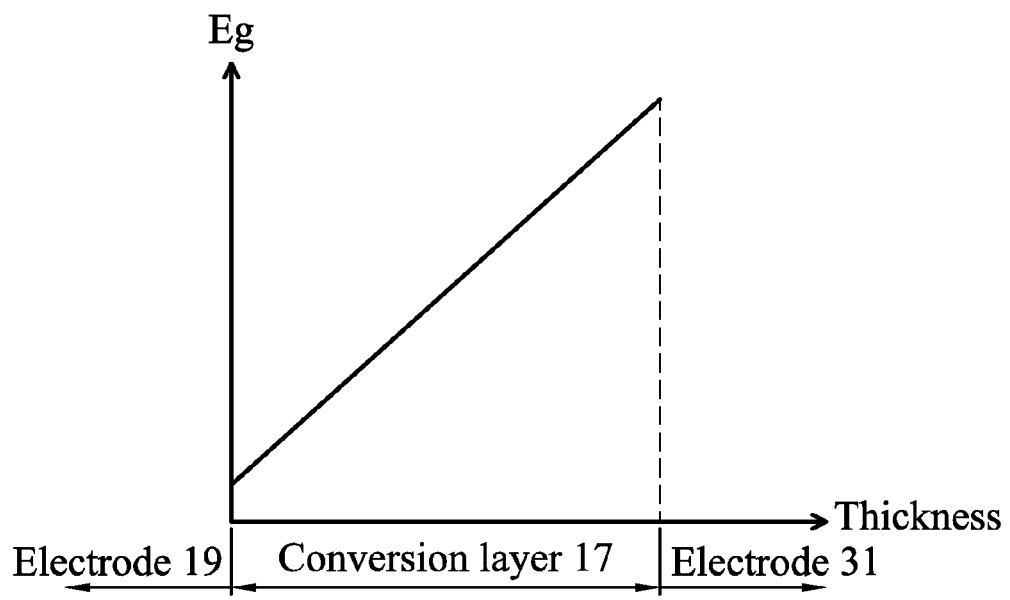
FIGS. 4A, 4B, 4C, 4D, and 4E show lines of energy gap versus thickness of conversion layers in embodiments of the disclosure.
Figure 4B:
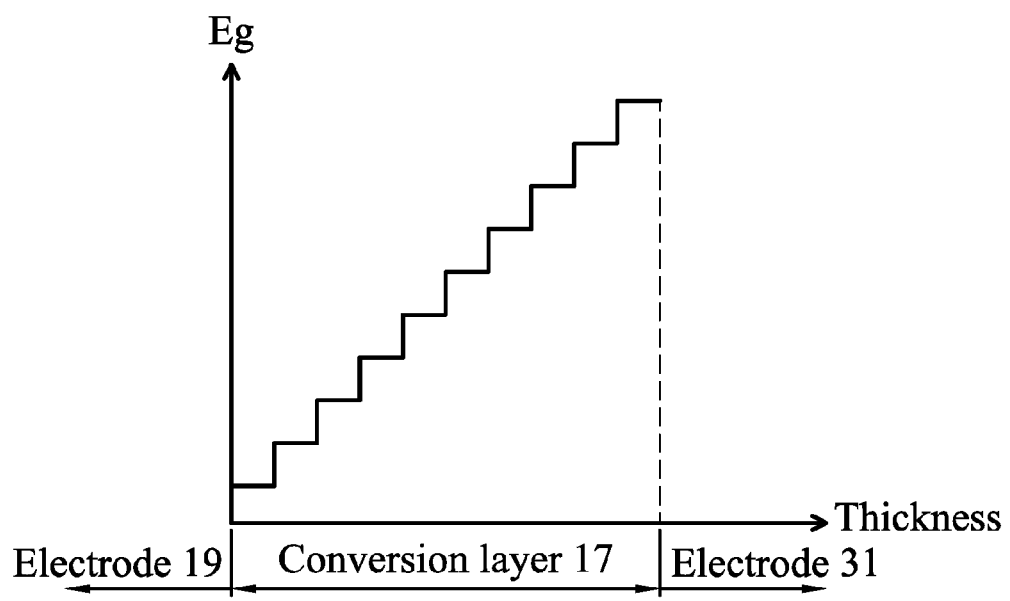
Figure 4C:
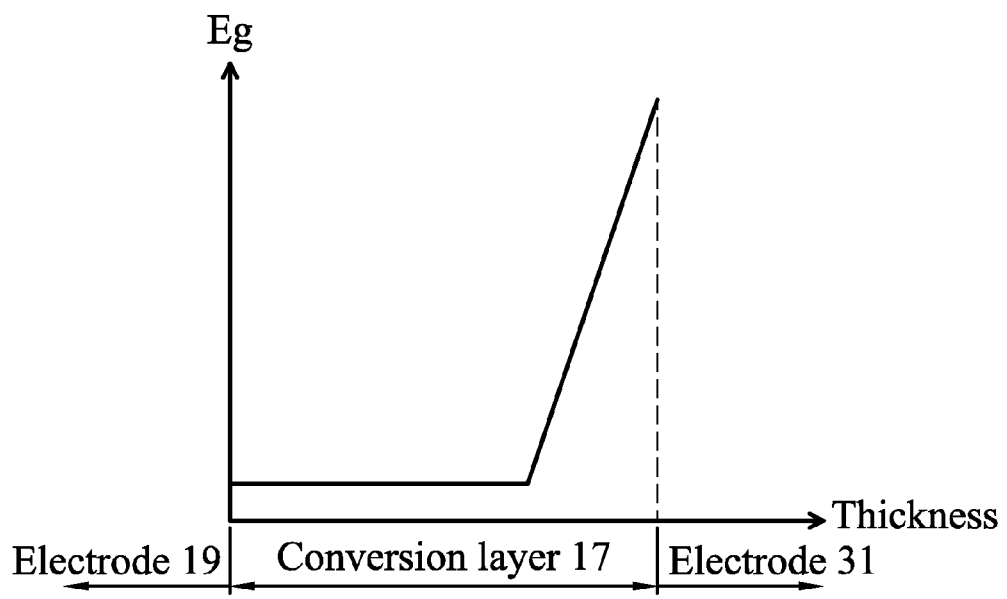
Figure 4D:
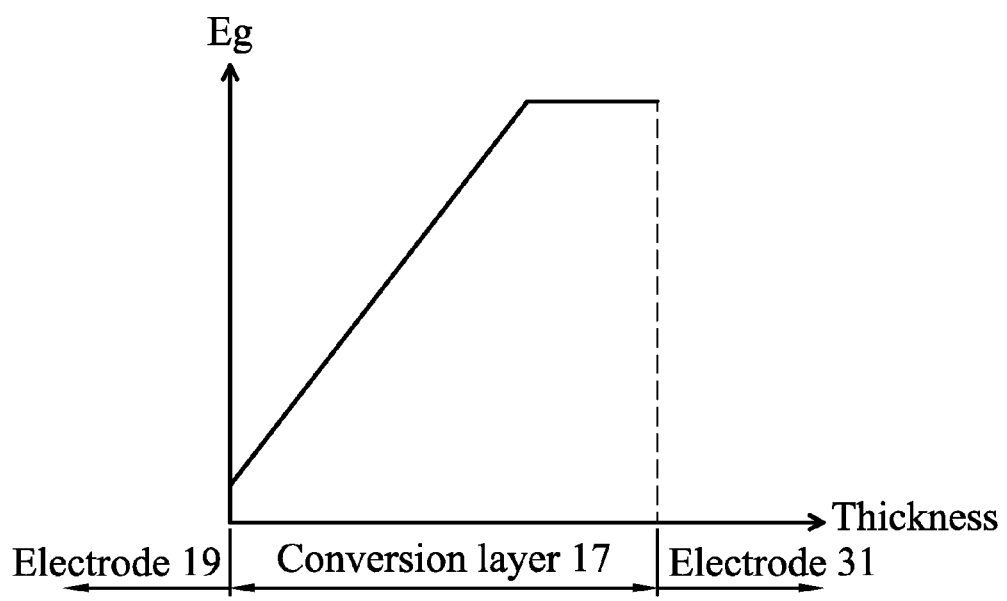
Figure 4E:
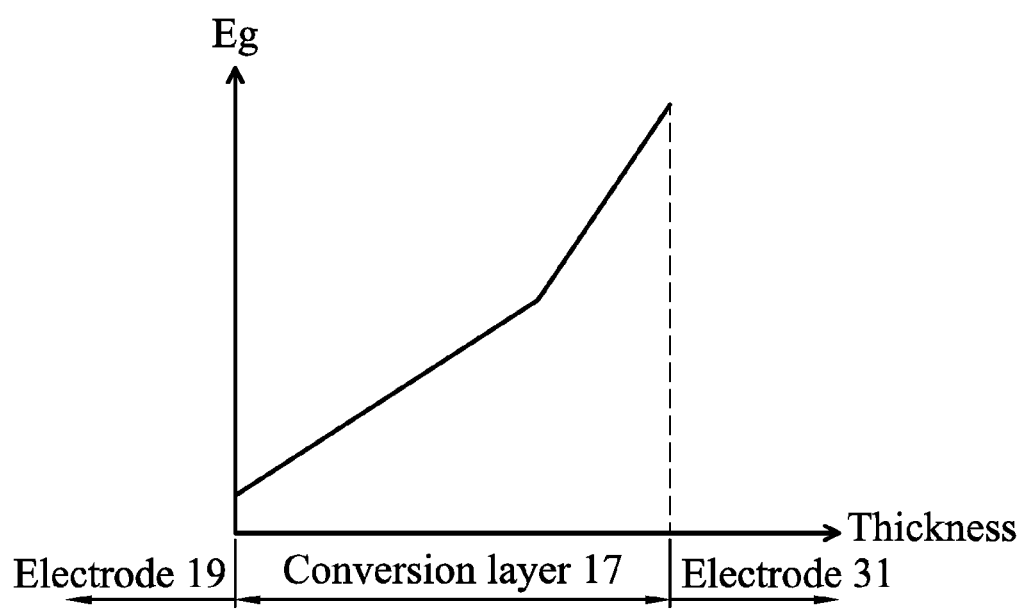

The composition-gradient conversion layer 17 formed in FIG. 2A has an energy gap diagram as shown in FIG. 4A, and the composition-gradient conversion layer 17 has an energy gap diagram as shown in FIG. 4B. It should be understood that the composition-gradient conversion layer 17, with a part adjacent to the electrode 19 having an energy gap lower than that of a part adjacent to the electrode 31, can be formed by the above processes. In addition, the energy gap of the conversion layer 17 may have other designs as shown in FIG. 4C, 4D, or 4E.

In one embodiment, the $M^1X^1{}_2$ provided by the deposition source 11 in FIG. 1 is $SnI_2$, the $M^2X^2{}_2$ provided by the deposition source 13 in FIG. 1 is $PbI_2$, and the $AX^1{}_tX^2{}_{(1-t)}$ provided by the deposition source 15 was $(CH_3NH_3)I$. As such, a part of the conversion layer 17 adjacent to the electrode 19 can be $Sn(CH_3NH_3)I_3$ with an energy gap of 1.1 eV, a part of the conversion layer 17 adjacent to the electrode 31 can be $Pb(CH_3NH_3)I_3$ with an energy gap of 1.5 eV, and the composition between the electrodes 19 and 31 can be $Sn_mPb_{(1-m)}(CH_3NH_3)I_3$.

In one embodiment, the $M^1X^1{}_2$ provided by the deposition source 11 in FIG. 1 is $PbI_2$, the $M^2X^2{}_2$ provided by the deposition source 13 in FIG. 1 is $PbBr_2$, and the $AX^1{}_tX^2{}_{(1-t)}$ provided by the deposition source 15 was $(CH_3NH_3)I_tBr_{(1-t)}$. As such, a part of the conversion layer 17 adjacent to the electrode 19 can be $Pb(CH_3NH_3)I_3$ with an energy gap of 1.5 eV, a part of the conversion layer 17 adjacent to the electrode 31 can be $Pb(CH_3NH_3)Br_3$ with an energy gap of 2.3 eV, and the composition between the electrodes 19 and 31 can be $Pb(CH_3NH_3)[I_xBr_{(1-x)}]_3$.

The deposition sources 11, 13, and 15 can be sputtering sources or evaporation sources. If the sputtering sources are selected, the ratio of $M^1X^1{}_2$ and $M^2X^2{}_2$ can be fine-tuned by controlling the energy bombarding the target. If the evaporation sources are selected, the ratio of $M^1X^1{}_2$ and $M^2X^2{}_2$ can be fine-tuned by controlling the temperature of the evaporation sources. In addition, the ratio of $X^1$ and $X^2$ in $AX^1{}_tX^2{}_{(1-t)}$ can be fine-tuned by controlling the flow rate of the halogen gas reacting with A.

Figure 5:
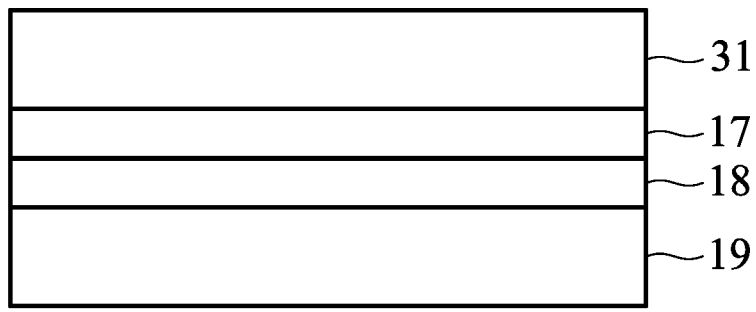
FIG. 5 shows a solar cell in one embodiment of the disclosure.

In another embodiment of the disclosure, a conversion layer 18 can be deposited on the electrode 19 before depositing the conversion layer 17 on the electrode 19. As shown in FIG. 5, the conversion layer 18 is disposed between the electrode 19 and the conversion layer 17. A part of the conversion layer 18 adjacent to the electrode 19 has an energy gap higher than that of a part of the conversion layer 18 adjacent to the conversion layer 17, a part of the conversion layer 18 adjacent to the conversion layer 17 has an energy gap equal to that of a part of the conversion layer 17 adjacent to the conversion layer 18, and a part of the conversion layer 18 adjacent to the electrode 19 has an energy gap lower than that of a part of the conversion layer 17 adjacent to the electrode 31.

Figure 6:
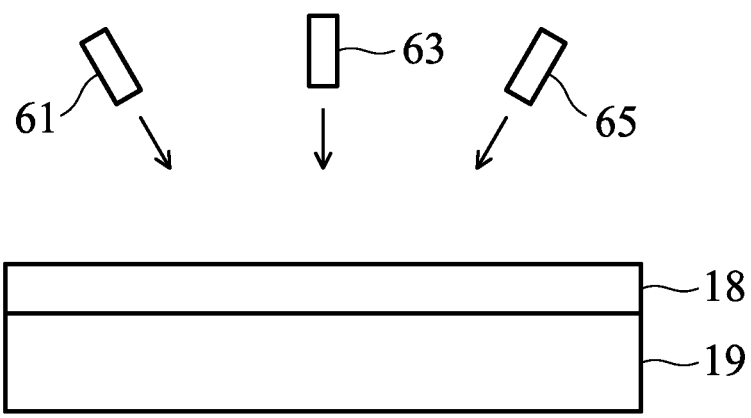
FIG. 6 shows the deposition of the conversion layer in one embodiment of the disclosure.

In one embodiment, the step of depositing the conversion layer 18 is described as below. m' parts by mole of $M^3X^3{}_2$ is provided by a deposition source 61, 1-m' parts by mole of $M^4X^4{}_2$ is provided by a deposition source 63, and an amount of $AX^3{}_{t'}X^4{}_{(1-t')}$ is provided by a deposition source 65 to deposit the conversion layer 18 on the electrode 19, as shown in FIG. 6. The conversion layer 18 has a composition of $M^3{}_{m'}M^4{}_{(1-m')}AX^3{}_{(2m'+t')}X^4{}_{(3-2m'-t')}$, m is decreased with a longer deposition time, t is decreased with a longer deposition time, $1 \geq m' \geq 0$, and $1 \geq t' \geq 0$. $M^3{}_{m'}M^4{}_{(1-m')}AX^3{}_{(2m'+t')}X^4{}_{(3-2m'-t')}$ can be represented as $M^3{}_{m'}M^4{}_{(1-m')}A[X^3{}_{x'}X^4{}_{(1-x')}]_3$, wherein $x'=(2m'+t')/3$, and m' and x' are greater at a location that is closer to the electrode 19. Each of $M^3$ and $M^4$ is independently a divalent cation of Ge, Sn, or Pb, A is a monovalent cation of methylammonium, ethylammonium, or formamidinium, and each of $X^3$ and $X^4$ is independently a monovalent anion of halogen. $M^3$ has a higher atomic number than $M^4$, $X^3$ has a lower atomic number than $X^4$, or a combination thereof.

The deposition sources 61, 63, and 65 can be sputtering sources or evaporation sources. If the sputtering sources are selected, the ratio of $M^3X^3{}_2$ and $M^4X^4{}_2$ can be fine-fine-tuned by controlling the energy bombarding the target. If the evaporation sources are selected, the ratio of $M^3X^3{}_2$ and $M^4X^4{}_2$ can be fine-tuned by controlling the temperature of the evaporation sources. In addition, the ratio of $X^3$ and $X^4$ in $AX^3{}_tX^4{}_{(1-t)}$ can be fine-tuned by controlling the flow rate of the halogen gas reacting with A.

In one embodiment of the disclosure, the composition of a part of the conversion layer 18 adjacent the electrode 19 is gradually changed from $Pb(CH_3NH_3)[I_xBr_{(1-x)}]_3$ ($0<x<1$) to $Pb(CH_3NH_3)I_3$, and the composition of the conversion layer 17 is gradually changed from $Pb(CH_3NH_3)I_3$ (the interface between the conversion layers 17 and 18) to $Pb(CH_3NH_3)Br_3$. In another embodiment, the composition of a part of the conversion layer 18 adjacent the electrode 19 is gradually changed from $Sn_mPb_{(1-m)}(CH_3NH_3)I_3$ ($0<m<1$) to $Sn(CH_3NH_3)I_3$, and the composition of the conversion layer 17 is gradually changed from $Sn(CH_3NH_3)I_3$ (the interface between the conversion layers 17 and 18) to $Pb(CH_3NH_3)I_3$.

Figure 7A:
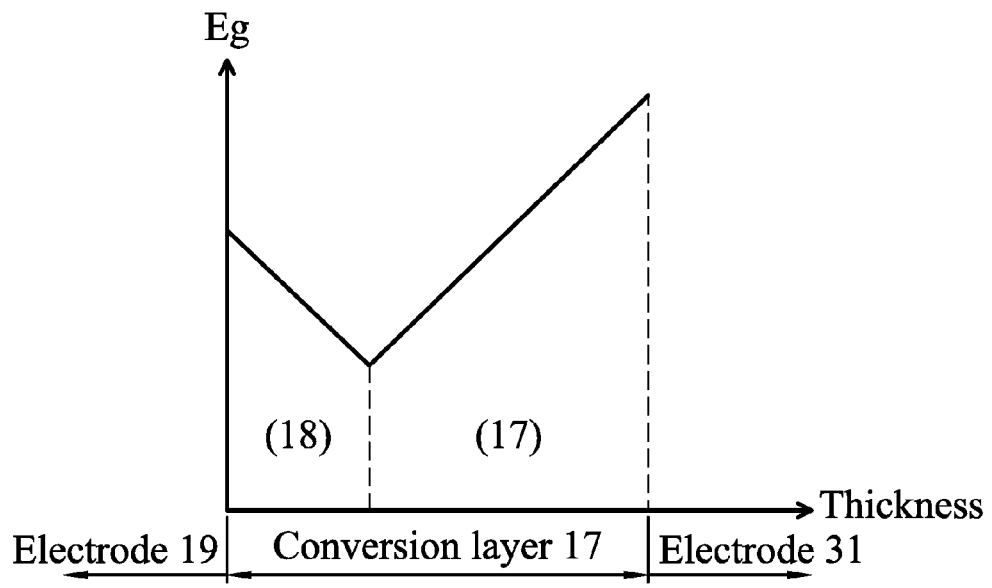
FIGS. 7A and 7B show lines of energy gap versus thickness of conversion layers in embodiments of the disclosure.
Figure 7B:
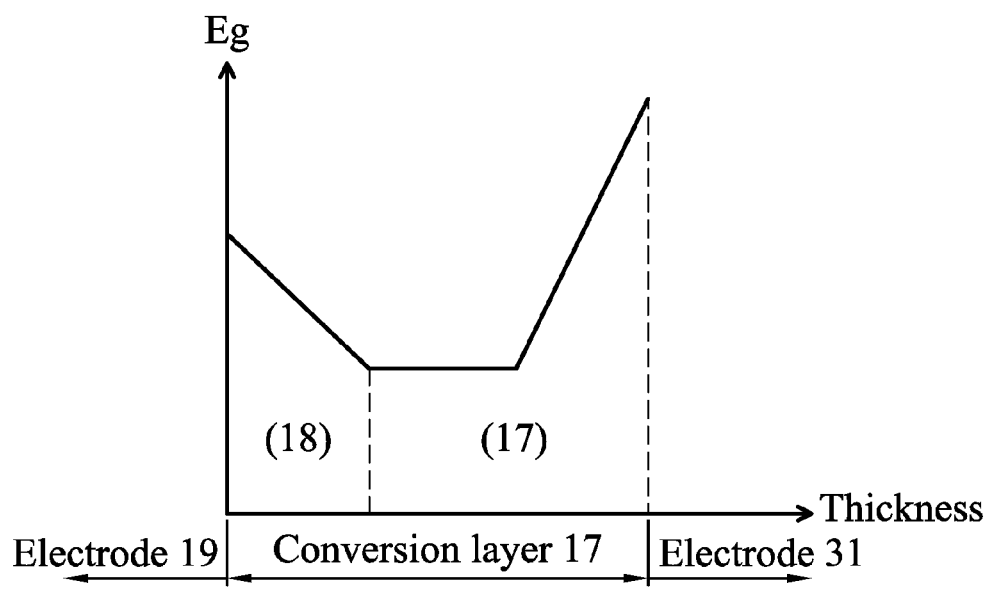

For example, the conversion layers 18 and 17 may have energy gap diagrams as shown in FIG. 7A or 7B. Note that the energy gap diagram of the conversion layers 18 and 17 can be fine-tuned with other changes in FIGS. 4B to 4E.

In another embodiment, m parts by mole of $M^1X^1_2$ is provided by a deposition source 11 and 1−m parts by mole of $M^2X^2_2$ is provided by a deposition source 13 to deposit a $M^1_mM^2_{(1-m)}X^1_{2m}X^2_{(2-2m)}$ layer on an electrode 19. Thereafter, $AX^1$ or $AX^2$ is provided by a deposition source 15, such that $AX^1$ or $AX^2$ reacts with the $M^1_mM^2_{(1-m)}X^1_{2m}X^2_{(2-2m)}$ layer to form a conversion layer 17 on the electrode 19, wherein the conversion layer 17 is a composition-gradient perovskite of $M^1_mM^2_{(1-m)}AX^1_{(2m+1)}X^2_{(2-2m)}$ or $M^1_mM^2_{(1-m)}AX^1_{(2m)}X^2_{(3-2m)}$. An electrode 31 is then formed on the conversion layer 17, as shown in FIG. 3. $M^1_mM^2_{(1-m)}AX^1_{(2m+1)}X^2_{(2-2m)}$ can be represented as $M^1_mM^2_{(1-m)}A[X_xX^2_{(1-x)}]_3$, wherein $x=(2m+1)/3$, and m and x are greater at a location that is closer to the electrode 19. $M^1_mM^2_{(1-m)}AX^1_{(2m)}X^2_{(3-2m)}$ can be represented as $M^1_mM^2_{(1-m)}A[X^1_xX^2_{(1-x)}]_3$, wherein $x=2m/3$, and m and x are greater at a location that is closer to the electrode 19.

A part of the conversion layer 17 adjacent to the electrode 19 has an energy gap lower than that of a part of the conversion layer 17 adjacent to the electrode 31. In the above deposition, m is decreased with a longer deposition time and $1 \geq m \geq 0$. Each of $M^1$ and $M^2$ is independently a divalent cation of Ge, Sn, or Pb. A is a monovalent cation of methylammonium, ethylammonium, or formamidinium. Each of $X^1$ and $X^2$ is independently a monovalent anion of halogen. In the composition of the conversion layer 17, $M^1$ has a lower atomic number than $M^2$, $X^1$ has a higher atomic number than $X^2$, or a combination thereof.

Compared to above embodiments, this embodiment is different due to the $M^1_mM^2_{(1-m)}X^1_{2m}X^2_{(2-2m)}$ is pre-formed and $AX^1$ or $AX^2$ are then provided to react with $M^1_mM^2_{(1-m)}X^1_{2m}X^2_{(2-2m)}$ to form the conversion layer, rather than the $M^1X^1$, $M^2X^2$, and $AX^1$ (or $AX^2$) are simultaneously provided and reacted to directly from the conversion layer. The composition and the energy gap diagram of the conversion layer 17 in this embodiment are similar to that in the above embodiments and omitted here.

Similar to the above embodiments, a composition-gradient conversion layer 18 can be further deposited on the electrode 19 before depositing the conversion layer 17 in this embodiment. In other words, the conversion layer 18 is disposed between the conversion layer 17 and the electrode 19. A part of the conversion layer 18 adjacent to the electrode 19 has an energy gap higher than that of a part of the conversion layer 18 adjacent to the conversion layer 17, a part of the conversion layer 18 adjacent to the conversion layer 17 has an energy gap equal to that of a part of the conversion layer 17 adjacent to the conversion layer 18, and a part of the conversion layer 18 adjacent to the electrode 19 has an energy gap lower than that of a part of the conversion layer 17 adjacent to the electrode 31. For example, the energy gap of the conversion layers 18 and 17 can be referred to FIGS. 7A and 7B.

In one embodiment, the step of depositing the conversion layer is described as below. m' parts by mole of $M^3X^3_2$ is provided by the deposition source 61 and 1−m' parts by mole of $M^4X^4_2$ is provided by the deposition source 63 to deposit a $M^3_{m'}M^4_{(1-m')}X^3_{2m'}X^4_{(2-2m')}$ layer on the electrode 19. $AX^3$ or $AX^4$ is then provided by the deposition source 65, such that $AX^3$ or $AX^4$ reacts with the $M^3_{m'}M^4_{(1-m')}X^3_{2m'}X^4_{(2-2m')}$ layer to form a conversion layer 18 on the electrode 19, wherein the conversion layer 18 is a composition-gradient perovskite of $M^3_{m'}M^4_{(1-m')}AX^3_{(2m'+1)}X^4_{(2-2m')}$ or $M^3_{m'}M^4_{(1-m')}AX^3_{(2m')}X^4_{(3-2m')}$. $M^3_{m'}M^4_{(1-m')}AX^3_{(2m'+1)}X^4_{(2-2m')}$ can be represented as $M^3_{m'}M^4_{(1-m')}A[X^3_{x'}X^4_{(1-x')}]_3$, wherein $x'=(2m'+1)/3$, and m' and x' are greater at a location that is closer to the electrode 19. $M^3_{m'}M^4_{(1-m')}AX^3_{(2m')}X^4_{(3-2m')}$ can be represented as $M^3_{m'}M^4_{(1-m')}A[X^3_{x'}X^4_{(1-x')}]_3$, wherein $x'=(2m')/3$, and m' and x' are greater at a location that is closer to the electrode 19. m' is decreased with a longer deposition time and $1 \geq m' \geq 0$. Each of $M^3$ and $M^4$ is independently a divalent cation of Ge, Sn, or Pb, A is a monovalent cation of methylammonium, ethylammonium, or formamidinium, and each of $X^3$ and $X^4$ is independently a monovalent anion of halogen. In the composition of the conversion layer 18, $M^3$ has a higher atomic number than $M^4$, $X^3$ has a lower atomic number than $X^4$, or a combination thereof.

Compared to conventional skills, the processes of manufacturing the perovskite conversion layers in the disclosure are free of solvent. As such, the different perovskite compositions in different layers will not be dissolved and mixed by solvent. In other words, the method of the disclosure may control the perovskite composition in different thicknesses of the conversion layer, thereby tuning the energy gap of the conversion layer to improve the conversion efficiency of the solar cell.

Below, exemplary embodiments will be described in detail with reference to the accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Comparative Example 1

In FIG. 3, the electrode 19 was a $TiO_2$ layer with a thickness of 90 nm, the electrode 31 was a thin gold film, the conversion layer 17 was a $Pb(CH_3NH_3)I_3$ layer with a thickness of 400 nm, and a hole transport layer (not shown) between the conversion layer 17 and the electrode 31 was a Spiro-OMeTAD layer with a thickness of 400 nm. The properties of the above solar cell were simulated and calculated by Analysis of Microelectronic and Photonic Structures-1D (AMPS-1D) as described below. The solar cell had an open-circuit voltage of 1.272V, a short-circuit current of 21.683 mA/cm², a filling factor of 0.826, and a conversion efficiency of 22.722%.

Comparative Example 2

In FIG. 3, the electrode 19 was a $TiO_2$ layer with a thickness of 90 nm, the electrode 31 was a thin gold film, and the conversion layer 17 was a $Pb(CH_3NH_3)I_3$ layer with a thickness of 400 nm. The properties of the above solar cell were simulated and calculated by AMPS-1D as described below. The solar cell had an open-circuit voltage of 0.838V, a short-circuit current of 17.945 mA/cm², a filling factor of 0.804, and a conversion efficiency of 12.095%.

Example 1

Figure 8A:
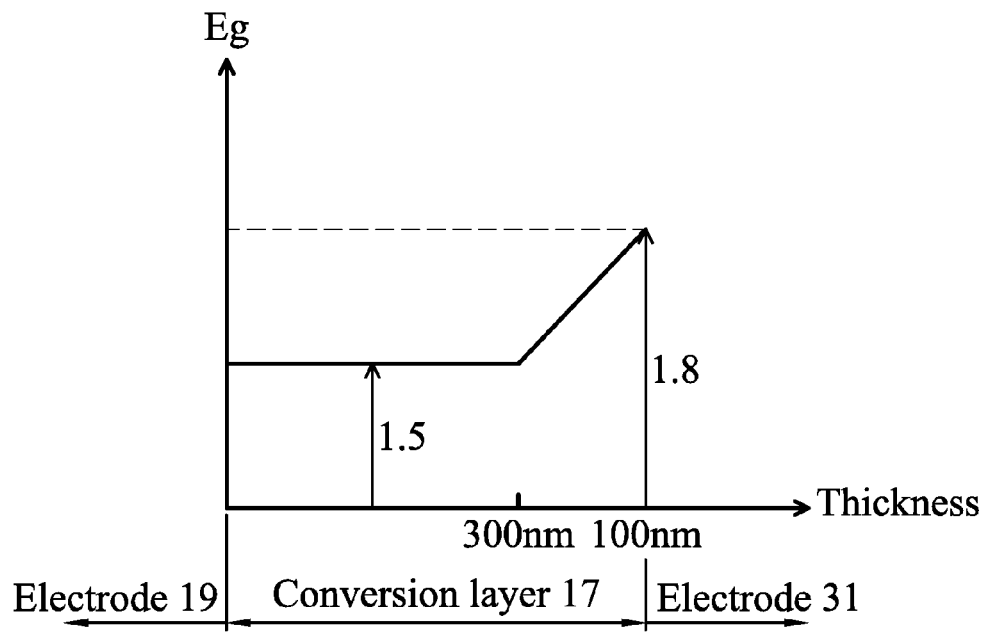
FIGS. 8A, 8B, and 8C show lines of energy gap versus thickness of conversion layers in embodiments of the disclosure.

In FIG. 3, the electrode 19 was a $TiO_2$ layer with a thickness of 90 nm, the electrode 31 was a thin gold film, a part of the conversion layer 17 adjacent to the electrode 19 was $Pb(CH_3NH_3)I_3$ with a thickness of 300 nm, and a composition-gradient part of the conversion layer 17 was Pb(CH$_3$NH$_3$)[I$_x$Br$_{(1-x)}$]$_3$ with a thickness of 100 nm extending from Pb(CH$_3$NH$_3$)I$_3$ to Pb(CH$_3$NH$_3$)Br$_3$. The conversion layer 17 had an energy gap diagram as shown in FIG. 8A. The properties of the above solar cell were simulated and calculated by AMPS-1D as described below. The solar cell had an open-circuit voltage of 1.284V, a short-circuit current of 21.136 mA/cm$^2$, a filling factor of 0.840, and a conversion efficiency of 22.807%.

Example 2

Figure 8B:
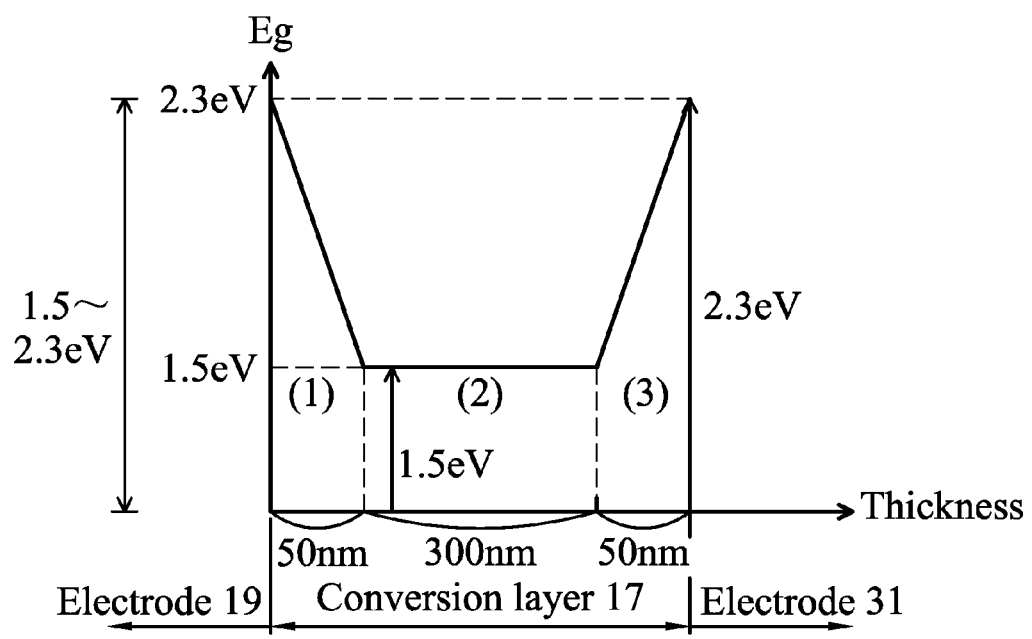

In FIG. 3, the electrode 19 was a TiO$_2$ layer with a thickness of 90 nm, the electrode 31 was a thin gold film, and the conversion layer 17 was divided to three regions from the electrode 19 to the electrode 31: (1) a composition-gradient part of Pb(CH$_3$NH$_3$)[I$_x$Br$_{(1-x)}$]$_3$ with a thickness of about 50 nm gradually changed to Pb(CH$_3$NH$_3$)I$_3$, wherein the Pb(CH$_3$NH$_3$)[I$_x$Br$_{(1-x)}$]$_3$ had an energy gap that gradually changed from 1.5 eV (or 1.6 eV, 1.8 eV, 2.0 eV, 2.3 eV) to 1.5 eV; (2) a part of Pb(CH$_3$NH$_3$)I with a thickness of about 300 nm, wherein the Pb(CH$_3$NH$_3$)I had an energy gap of 1.5 eV; and (3) a composition-gradient part of Pb(CH$_3$NH$_3$)[I$_x$Br$_{(1-x)}$]$_3$ with a thickness of about 50 nm gradually changed to Pb(CH$_3$NH$_3$)Br$_3$, wherein the Pb(CH$_3$NH$_3$)[I$_x$Br$_{(1-x)}$]$_3$ had an energy gap that gradually changed from 1.5 eV to 2.3 eV. The conversion layer 17 had an energy gap diagram as shown in FIG. 8B. The properties of the above solar cells, e.g. an open-circuit voltage, a short-circuit current, a filling factor, and a conversion efficiency, were simulated and calculated by AMPS-1D and tabulated in Table 1.

TABLE 1

| The energy gap of the part of the conversion layer 17 adjacent to the electrode 19 (Eg) | Open-circuit voltage (V) | Short-circuit current (mA/cm$^2$) | Filling factor | Conversion efficiency (%) |
| --- | --- | --- | --- | --- |
| 1.5 | 1.278 | 21.448 | 0.839 | 23 |
| 1.6 | 1.283 | 21.393 | 0.84 | 23.051 |
| 1.8 | 1.284 | 21.217 | 0.839 | 22.863 |
| 2.0 | 1.289 | 21.187 | 0.673 | 18.399 |
| 2.3 | 1.566 | 21.162 | 0.256 | 8.439 |

Example 3

Figure 8C:
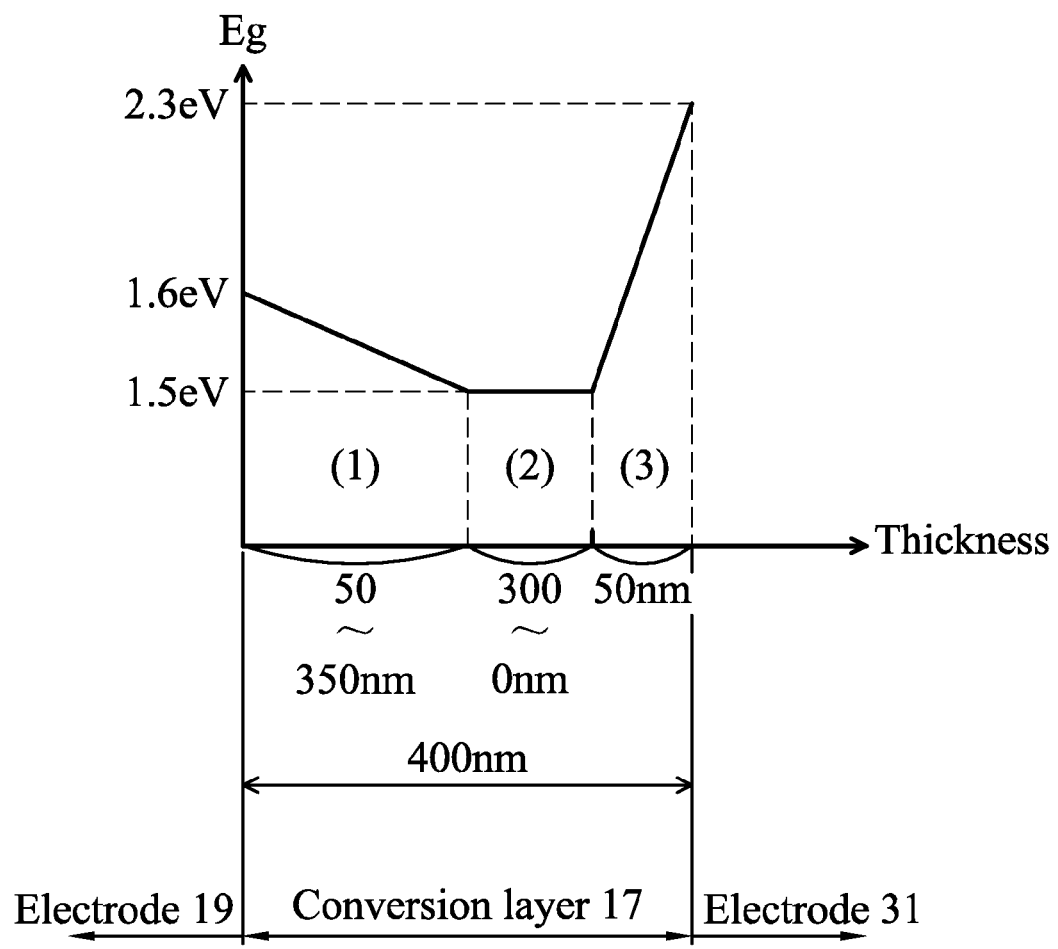

In FIG. 3, the electrode 19 was a TiO$_2$ layer with a thickness of 90 nm, the electrode 31 was a thin gold film, and the conversion layer 17 was divided to three regions from the electrode 19 to the electrode 31: (1) a composition-gradient part of Pb(CH$_3$NH$_3$)[I$_x$Br$_{(1-x)}$]$_3$ with a thickness of about 50 nm (or 100 nm, 200 nm, 300 nm, 350 nm) gradually changed to Pb(CH$_3$NH$_3$)I$_3$, wherein the Pb(CH$_3$NH$_3$)[I$_x$Br$_{(1-x)}$]$_3$ had an energy gap that gradually changed from 1.6 eV to 1.5 eV; (2) a part of Pb(CH$_3$NH$_3$)I with a thickness of about 300 nm (or 250 nm, 150 nm, 50 nm, 0 nm), wherein the Pb(CH$_3$NH$_3$)I had an energy gap of 1.5 eV; and (3) a composition-gradient part of Pb(CH$_3$NH$_3$)[I$_x$Br$_{(1-x)}$]$_3$ with a thickness of about 50 nm gradually changed to Pb(CH$_3$NH$_3$)Br$_3$, wherein the Pb(CH$_3$NH$_3$)[I$_x$Br$_{(1-x)}$]$_3$ had an energy gap that gradually changed from 1.5 eV to 2.3 eV. The conversion layer 17 had an energy gap diagram as shown in FIG. 8C. The properties of the above solar cells, e.g. an open-circuit voltage, a short-circuit current, a filling factor, and a conversion efficiency, were simulated and calculated by AMPS-1D and tabulated in Table 2.

TABLE 2

| The thickness of region (1) of the conversion layer 17 (nm) | The thickness of region (2) of the conversion layer 17 (nm) | Open-circuit voltage (V) | Short-circuit current (mA/cm$^2$) | Filling factor | Conversion efficiency (%) |
| --- | --- | --- | --- | --- | --- |
| 50 | 300 | 1.283 | 21.393 | 0.84 | 23.051 |
| 100 | 250 | 1.289 | 21.336 | 0.84 | 23.113 |
| 200 | 150 | 1.304 | 21.222 | 0.841 | 23.289 |
| 300 | 50 | 1.327 | 21.101 | 0.842 | 23.582 |
| 350 | 0 | 1.344 | 21.034 | 0.843 | 23.830 |

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A method of manufacturing a solar cell, comprising:
providing m parts by mole of M$^1$X$^1_2$ by a first deposition source, providing 1-m parts by mole of M$^2$X$^2_2$ by a second deposition source, and providing an amount of AX$^1_t$X$^2_{(1-t)}$ by a third deposition source to deposit a first conversion layer on a first electrode; and
forming a second electrode on the first conversion layer, wherein a part of the first conversion layer adjacent to the first electrode has an energy gap lower than that of a part of the first conversion layer adjacent to the second electrode,
wherein the first conversion layer has a composition of M$^1_m$M$^2_{(1-m)}$AX$^1_{(2m+t)}$X$^2_{(3-2m-t)}$, 1≥m≥0, and 1≥t≥0, and the first conversion layer is a composition-gradient perovskite obtained by gradually decreasing the part by mole of m and t as the deposition proceeds;
wherein each of M$^1$ and M$^2$ is independently a divalent cation of Ge, Sn, or Pb,
wherein A is a monovalent cation of methylammonium, ethylammonium, or formamidinium,
wherein each of X$^1$ and X$^2$ is independently a monovalent anion of halogen,
wherein M$^1$ has a lower atomic number than M$^2$, X$^1$ has a higher atomic number than X$^2$, or a combination thereof.

2. The method as claimed in claim 1, wherein the first deposition source, the second deposition source, and the third deposition source comprise a sputtering source or an evaporation source.

3. The method as claimed in claim 1, further comprising depositing a second conversion layer between the first conversion layer and the first electrode, wherein
a part of the second conversion layer adjacent to the first electrode has an energy gap higher than that of a part of the second conversion layer adjacent to the first conversion layer,
a part of the second conversion layer adjacent to the first conversion layer has an energy gap equal to that of a part of the first conversion layer adjacent to the second conversion layer, and a part of the second conversion layer adjacent to the first electrode has an energy gap lower than that of a part of the first conversion layer adjacent to the second electrode, wherein the step of depositing the second conversion layer comprises:

providing m' parts by mole of $M^3X^3_2$ by a fourth deposition source, providing 1−m' parts by mole of $M^4X^4_2$ by a fifth deposition source, and providing an amount of $AX^3_{t'}X^4_{(1-t')}$ by a sixth deposition source to deposit the second conversion layer on the first electrode, wherein the second conversion layer has a composition of $M^3_{m'}M^4_{(1-m')}AX^3_{(2m'+t')}X^4_{(3-2m'-t')}$, 1≥m'≥0, and 1≥t'≥0, and the second conversion layer is a composition-gradient perovskite obtained by gradually decreasing the part by mole of m' and t' as the deposition proceeds;

wherein each of $M^3$ and $M^4$ is independently a divalent cation of Ge, Sn, or Pb, wherein A is a monovalent cation of methylammonium, ethylammonium, or formamidinium, wherein each of $X^3$ and $X^4$ is independently a monovalent anion of halogen, wherein $M^3$ has a higher atomic number than $M^4$, $X^3$ has a lower atomic number than $X^4$, or a combination thereof.

4. The method as claimed in claim 3, wherein the fourth deposition source, the fifth deposition source, and the sixth deposition source comprise a sputtering source or an evaporation source.

5. A method of manufacturing a solar cell, comprising:

providing m parts by mole of $M^1X^1_2$ by a first deposition source and providing 1−m parts by mole of $M^2X^2_2$ by a second deposition source to deposit a $M^1_mM^2_{(1-m)}X^1_{2m}X^2_{(2-2m)}$ layer on a first electrode;

providing $AX^1$ or $AX^2$ by a third deposition source, such that $AX^1$ or $AX^2$ reacts with the $M^1_mM^2_{(1-m)}X^1_{2m}X^2_{(2-2m)}$ layer to form a first conversion layer on the first electrode, wherein the first conversion layer is a composition-gradient perovskite of $M^1_mM^2_{(1-m)}AX^1_{(2m+1)}X^2_{(2-2m)}$ or $M^1_mM^2_{(1-m)}AX^1_{(2m)}X^2_{(3-2m)}$ obtained by gradually decreasing the part by mole of m as the deposition proceeds; and forming a second electrode on the first conversion layer, wherein a part of the first conversion layer adjacent to the first electrode has an energy gap lower than that of a part of the first conversion layer adjacent to the second electrode, wherein 1≥m≥0;

wherein each of $M^1$ and $M^2$ is independently a divalent cation of Ge, Sn, or Pb, wherein A is a monovalent cation of methylammonium, ethylammonium, or formamidinium, wherein each of $X^1$ and $X^2$ is independently a monovalent anion of halogen, wherein $M^1$ has a lower atomic number than $M^2$, $X^1$ has a higher atomic number than $X^2$, or a combination thereof.

6. The method as claimed in claim 5, wherein the first deposition source, the second deposition source, and the third deposition source comprise a sputtering source or an evaporation source.

7. The method as claimed in claim 5, further comprising depositing a second conversion layer between the first conversion layer and the first electrode, wherein the second conversion layer is a composition-gradient perovskite, a part of the second conversion layer adjacent to the first electrode has an energy gap higher than that of a part of the second conversion layer adjacent to the first conversion layer, a part of the second conversion layer adjacent to the first conversion layer has an energy gap equal to that of a part of the first conversion layer adjacent to the second conversion layer, and a part of the second conversion layer adjacent to the first electrode has an energy gap lower than that of a part of the first conversion layer adjacent to the second electrode, wherein the step of depositing the second conversion layer comprises:

providing m' parts by mole of $M^3X^3_2$ by a fourth deposition source and providing 1−m' parts by mole of $M^4X^4_2$ by a fifth deposition source to deposit a $M^3_{m'}M^4_{(1-m')}X^3_{2m'}X^4_{(2-2m')}$ layer on the first electrode; and providing $AX^3$ or $AX^4$ by a sixth deposition source, such that $AX^3$ or $AX^4$ reacts with the $M^3_{m'}M^4_{(1-m')}X^3_{2m'}X^4_{(2-2m')}$ layer to form a second conversion layer on the first electrode, wherein the second conversion layer is a composition-gradient perovskite of $M^3_{m'}M^4_{(1-m')}AX^3_{(2m'+1)}X^4_{(2-2m')}$ or $M^3_{m'}M^4_{(1-m')}AX^3_{(2m')}X^4_{(3-2m')}$ obtained by gradually decreasing the part by mole of m' as the deposition proceeds;

wherein 1≥m'≥0;

wherein each of $M^3$ and $M^4$ is independently a divalent cation of Ge, Sn, or Pb, wherein A is a monovalent cation of methylammonium, ethylammonium, or formamidinium, wherein each of $X^3$ and $X^4$ is independently a monovalent anion of halogen, wherein $M^3$ has a higher atomic number than $M^4$, $X^3$ has a lower atomic number than $X^4$, or a combination thereof.

8. The method as claimed in claim 7, wherein the fourth deposition source, the fifth deposition source, and the sixth deposition source comprise a sputtering source or an evaporation source.

* * * * *